United States Patent
Randall et al.

(10) Patent No.: US 7,460,375 B2
(45) Date of Patent: Dec. 2, 2008

(54) INTERFACE ASSEMBLY

(75) Inventors: Jack E. Randall, Felton, CA (US); Giovanni Coglitore, Saratoga, CA (US)

(73) Assignee: Rackable Systems, Inc., Fremont, CA (US)

( * ) Notice: Subject to any disclaimer, the term of this patent is extended or adjusted under 35 U.S.C. 154(b) by 399 days.

(21) Appl. No.: 11/125,941

(22) Filed: May 9, 2005

(65) Prior Publication Data

US 2005/0286235 A1 Dec. 29, 2005

Related U.S. Application Data

(60) Provisional application No. 60/568,969, filed on May 7, 2004, provisional application No. 60/569,025, filed on May 7, 2004, provisional application No. 60/569,020, filed on May 7, 2004, provisional application No. 60/569,019, filed on May 7, 2004.

(51) Int. Cl.
*H05K 5/00* (2006.01)
(52) U.S. Cl. ...................................................... 361/724
(58) Field of Classification Search ................... 361/724
See application file for complete search history.

(56) References Cited

U.S. PATENT DOCUMENTS

| | | | |
|---|---|---|---|
| 3,925,710 A * | 12/1975 | Ebert ........................... | 361/690 |
| 5,202,536 A | 4/1993 | Buonanno | |
| 5,347,430 A | 9/1994 | Curlee et al. | |
| 5,351,176 A | 9/1994 | Smith et al. | |
| 5,460,441 A | 10/1995 | Hastings et al. | |
| 5,684,271 A | 11/1997 | Scholder et al. | |
| 5,726,866 A | 3/1998 | Allen | |
| 6,163,454 A | 12/2000 | Strickler | |
| 6,215,659 B1 | 4/2001 | Chen | |
| 6,252,160 B1 | 6/2001 | Chang et al. | |
| 6,349,042 B1 | 2/2002 | Mills et al. | |
| 6,414,851 B2 | 7/2002 | Cherniski et al. | |
| 6,477,061 B1 | 11/2002 | Johnson | |
| 6,480,398 B1 | 11/2002 | Fiora et al. | |
| 6,482,046 B1 | 11/2002 | Salinas | |
| 6,496,366 B1 | 12/2002 | Coglitore et al. | |
| 6,512,673 B1 | 1/2003 | Wiley | |
| 6,560,114 B2 | 5/2003 | Berry et al. | |
| 6,594,150 B2 * | 7/2003 | Creason et al. ............. | 361/727 |
| 6,611,432 B2 | 8/2003 | Blood | |
| 6,621,000 B2 | 9/2003 | Jensen et al. | |
| 6,762,934 B2 | 7/2004 | Kitchen et al. | |
| 6,796,833 B2 | 9/2004 | Baker | |
| 6,839,237 B2 | 1/2005 | Berry et al. | |
| 6,862,173 B1 | 3/2005 | Konshak et al. | |
| 6,912,132 B2 | 6/2005 | Riddiford et al. | |
| 7,042,720 B1 | 5/2006 | Konshak et al. | |
| 7,136,283 B2 * | 11/2006 | Dobbs et al. ................ | 361/685 |
| 7,236,358 B2 * | 6/2007 | Dobbs et al. ................ | 361/685 |

(Continued)

*Primary Examiner*—Lisa Lea-Edmonds
(74) *Attorney, Agent, or Firm*—Cooley Godward Kronish LLP

(57) ABSTRACT

A computer system comprising an interface assembly configured to support one or more I/O connections. In one variation, the computer system comprises a main board housed within a chassis, a chassis connector coupled to the chassis, and one or more I/O cables coupled to the chassis connector. In another variation, the computer assembly comprises a computer rack with a plurality of connector interfaces, each of which is adapted for engaging a computer through a chassis connector with a plurality of I/O ports.

9 Claims, 12 Drawing Sheets

U.S. PATENT DOCUMENTS

| | | |
|---|---|---|
| 2002/0006026 A1* | 1/2002 | Takahashi et al. ........... 361/687 |
| 2002/0109971 A1* | 8/2002 | Gilley ......................... 361/724 |
| 2003/0124971 A1 | 7/2003 | Williams |
| 2003/0128516 A1 | 7/2003 | Faneuf et al. |
| 2003/0223193 A1* | 12/2003 | Smith et al. ................. 361/687 |
| 2004/0057216 A1* | 3/2004 | Smith et al. ................. 361/724 |
| 2005/0265004 A1 | 12/2005 | Coglitore et al. |

* cited by examiner

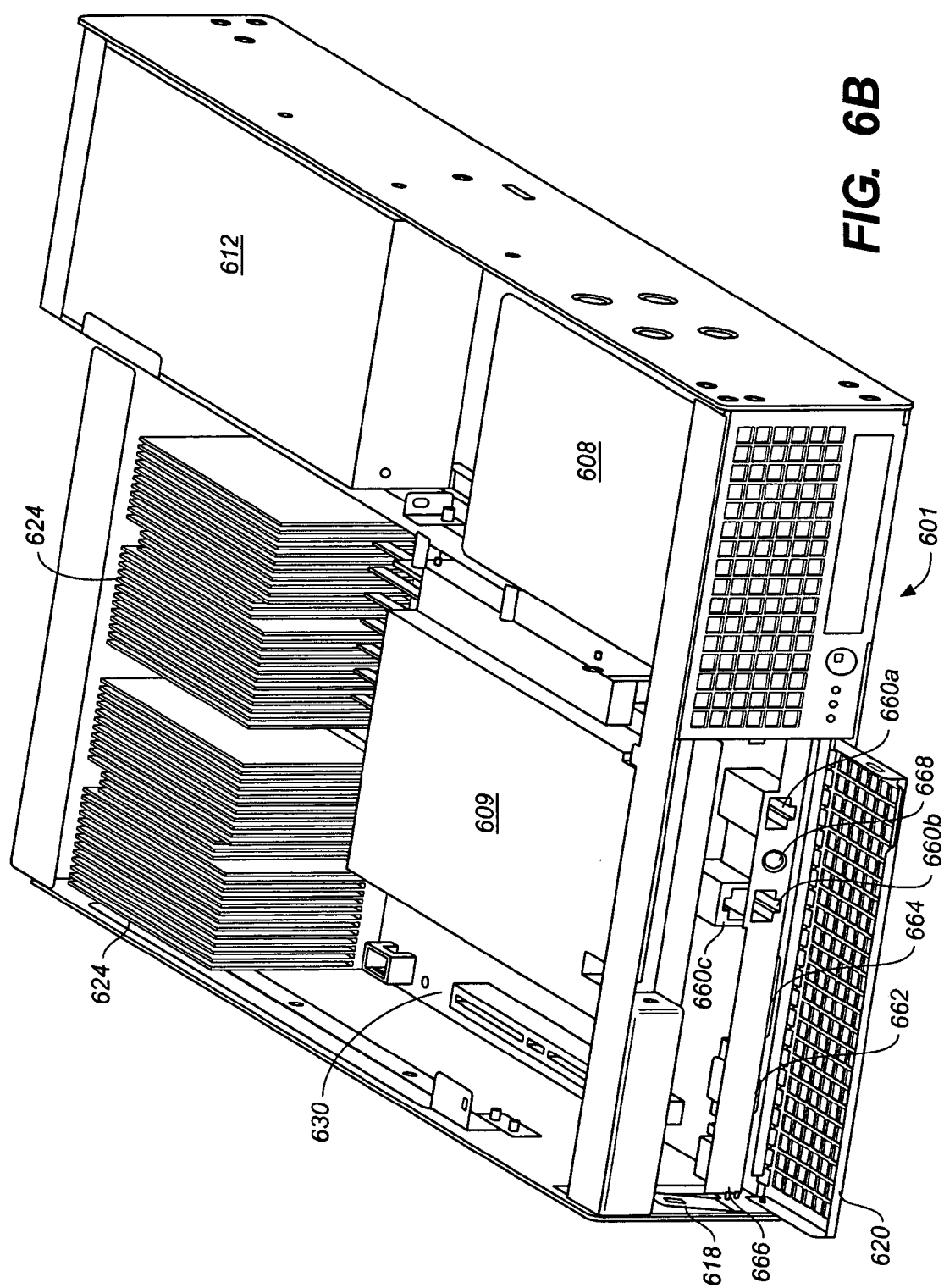

INTERFACE ASSEMBLY

CROSS-REFERENCE TO RELATED APPLICATION

This application claims the benefit of U.S. provisional patent application No. 60/568,969, entitled "INTERFACE ASSEMBLY" filed on May 7, 2004, U.S. provisional patent application No. 60/569,025, entitled "RACK MOUNTED COMPUTER SYSTEM", filed May 7, 2004, U.S. provisional patent application No. 60/569,020, entitled "ELECTROMAGNETIC INTERFERENCE SHIELD FOR I/O PORTS", filed May 7, 2004, and U.S. provisional patent application No. 60/569,019, entitled "DIRECTIONAL FAN ASSEMBLY", filed May 7, 2004, each of which is incorporated herein by reference in its entirety.

BACKGROUND OF THE INVENTION

As information technology has rapidly progressed, computer network centers such as server farms and server clusters have become increasingly important to our society. The server farms provide efficient data processing, storage, and distribution capability that supports a worldwide information infrastructure, which has come to dominate how we live and how we conduct our day to day business.

Typically, at a site where numerous computers are connected to a network, the computers and related equipment are stacked in racks, which are arranged in repeating rows. In conventional systems, the racks are configured to contain computer equipment having a standard size in compliance with the Electronic Industries Alliance ("EIA") "rack unit" or "U" standard. Each computer would have a height of 1U, 2U, or some U-multiple, with each U corresponding to approximately 1.75".

FIG. 1 shows a conventional rack 100 measuring roughly 19 inches wide, 30 inches deep and 74 inches high. This rack 100 is formed of a rectangular frame structure having four vertical supports 102 (two in the front and two in the back), each support 102 having a plurality of holes 104 (typically rectangular) formed along its length. Horizontal rails, which are used to support each individual component to be mounted in the rack, are attached to the vertical supports 102 using cage nuts that are passed through the holes in the supports. Walls may be attached to the sides and top of the frame structure and doors may be provided on the front side 105a and back side 105b in order to provide a complete enclosure for the rack system.

Each computer mounted in the rack 100 may comprise a computer chassis supporting a main board. The main board may be alternatively referred to as the motherboard or system board. The main board comprises the primary printed circuit board (PCB) of a computer. The basic circuitry and components used by a computer to function are generally either contained in or attached to the main board. The main board typically contains the system bus, processor and coprocessor sockets, memory sockets, serial and parallel ports, expansion slots, and peripheral controllers.

Conventional rack-based computer systems typically include a plurality of I/O connectors mounted onto the motherboard and accessed on the back side of the computer chassis. In some systems, I/O connectors may be accessed on the front side of the computer chassis. During installation of the computers into the rack, these I/O connectors may be coupled with the end connectors of corresponding I/O cables. For example, a conventional network I/O connector on a motherboard may be a female RJ-45 socket into which a male RJ-45 cable may be inserted in order to provide network connectivity for the computer. In other instances, the I/O connector may be a serial port which is mated with the end connector of a serial cable. Regardless of the type of I/O connector, this conventional design typically requires that an operator first insert the computer into the rack and then access the back side of the computer to manually connect and route the I/O cabling. Thus, an operator generally accesses the front sides of the computers via the front door of the rack enclosure and accesses the back sides of the computers via the back door of the rack enclosure.

With the increased densities of rack-based computer systems, the number of cables for a single rack can be overwhelming. In addition, when a single computer is removed from a fully installed conventional rack system, all of the cables connected to that unit must be uncoupled from the back side of the computer before the unit can be removed. Numerous cable management systems have been proposed for organizing the various cables, but these systems generally do not alleviate the need to manually connect the various I/O cables to the I/O connectors in the computers.

More recently, there has been interest in "blade" servers that include processors and memory located on a motherboard which can be inserted into a slot provided in a chassis mounted in a computer rack. In these systems, cooling, power, storage services, and network services may be accessed through a vertically-oriented backplane contained in the chassis and shared among a collection of blades. These "blade" servers may include an I/O and/or power connector on the back side of the motherboard which can be "blind mated" with a blind mate connector located in the backplane. "Blind mating" refers to the act of indirectly making these I/O or power connections by simply inserting the computer into the desired slot. The insertion force applied to the server during insertion into the rack causes the I/O connector on the back edge of the motherboard to mate with the corresponding I/O connector in the backplane.

In some "blade" systems, the I/O connectors on the motherboard are connectors complying with the CompactPCI standard. In conventional systems utilizing this blind mating, the motherboard is typically a vendor-specific, custom designed motherboard having the I/O connector mounted directly onto the printed circuit board forming the motherboard. A disadvantage of such a design is the cost associated with CompactPCI connectors and custom-designed motherboards.

Various manufacturers have different motherboard or main board designs, and these designs may further change as new processor and chipset technologies evolve. However, a computer system manufacturer may have an existing design for the computer chassis and rack, and may wish to utilize the existing chassis and rack design with the various main board designs available on the market in order to minimize development costs. Similarly, an end user of these rack-based computer systems may have already made an investment in the existing chassis and rack design and may wish to maintain consistency in the chassis and rack deployment while taking advantage of motherboard and processor advancements as additional computer systems are purchased in the future. In addition, it may be desirable to obtain the benefits of the blind mate connections of blade-type systems while utilizing industry standard motherboard designs.

BRIEF SUMMARY OF THE INVENTION

In accordance with embodiments of the present invention, a computer system is provided. The computer system comprises: a computer chassis; a main board provided in the computer chassis, the main board comprising a printed circuit board having a plurality of components provided thereon, said plurality of components comprising at least one I/O connector; a chassis connector coupled to the computer chassis and configured to couple with a rack connector in a rack assembly; and one or more I/O cables, each I/O cable coupling one of the I/O connectors to the chassis connector.

In accordance with embodiments of the present invention, a method of assembling a computer system is provided, comprising: connecting a proximal end of one or more I/O cables to at least one I/O connector provided on a main board contained in a computer chassis; and coupling a distal end of the one or more I/O cables to a chassis connector positioned along a back side of the computer chassis, said chassis connector being configured to couple with a corresponding connector in a rack assembly.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

BRIEF DESCRIPTION OF THE DRAWINGS

FIGS. 6A-6B are front perspective views of a computer, in accordance with embodiments of the present invention.

DETAILED DESCRIPTION OF THE INVENTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Figure 1:
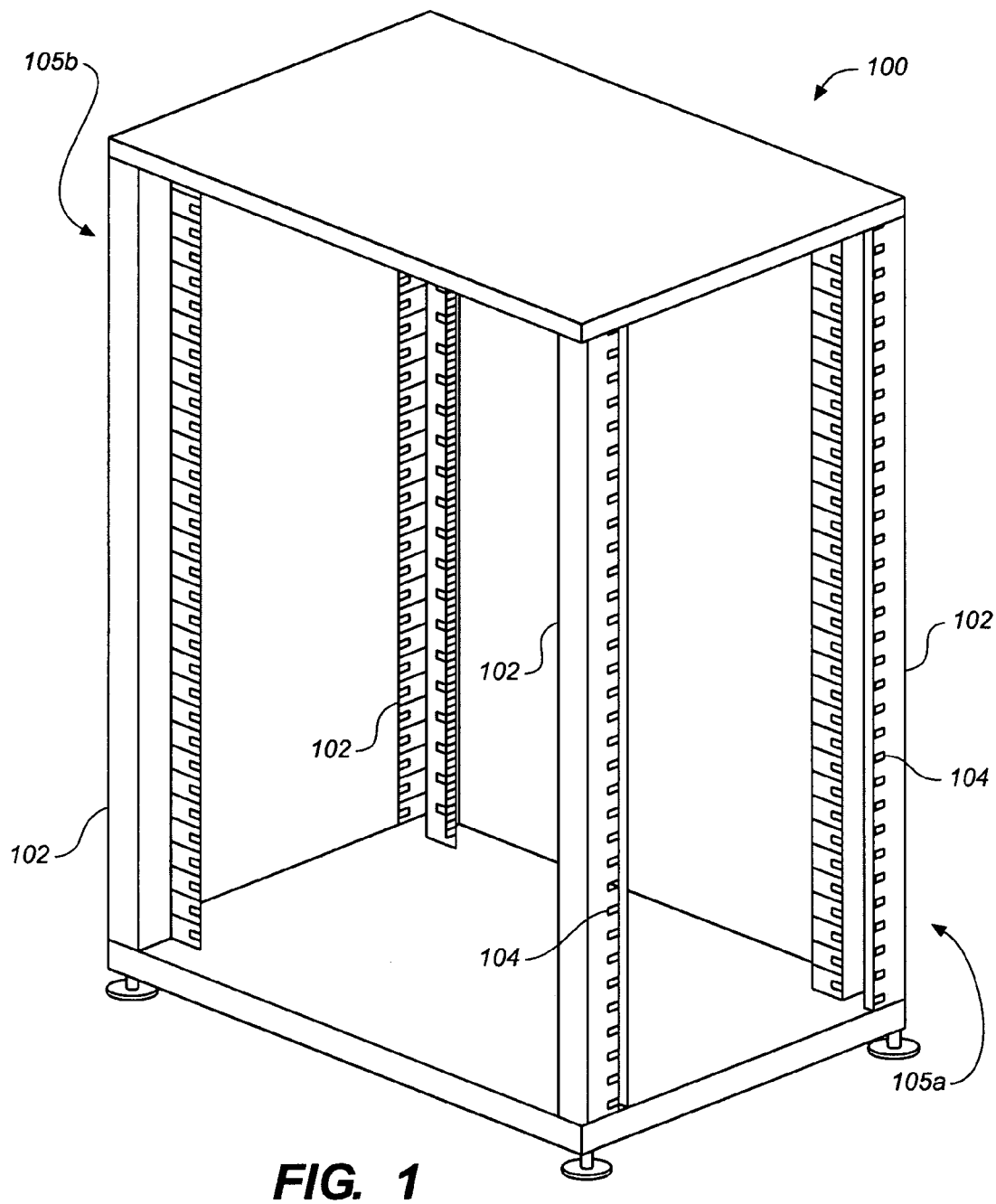
FIG. 1 shows a prior art computer rack.
Figure 2A:
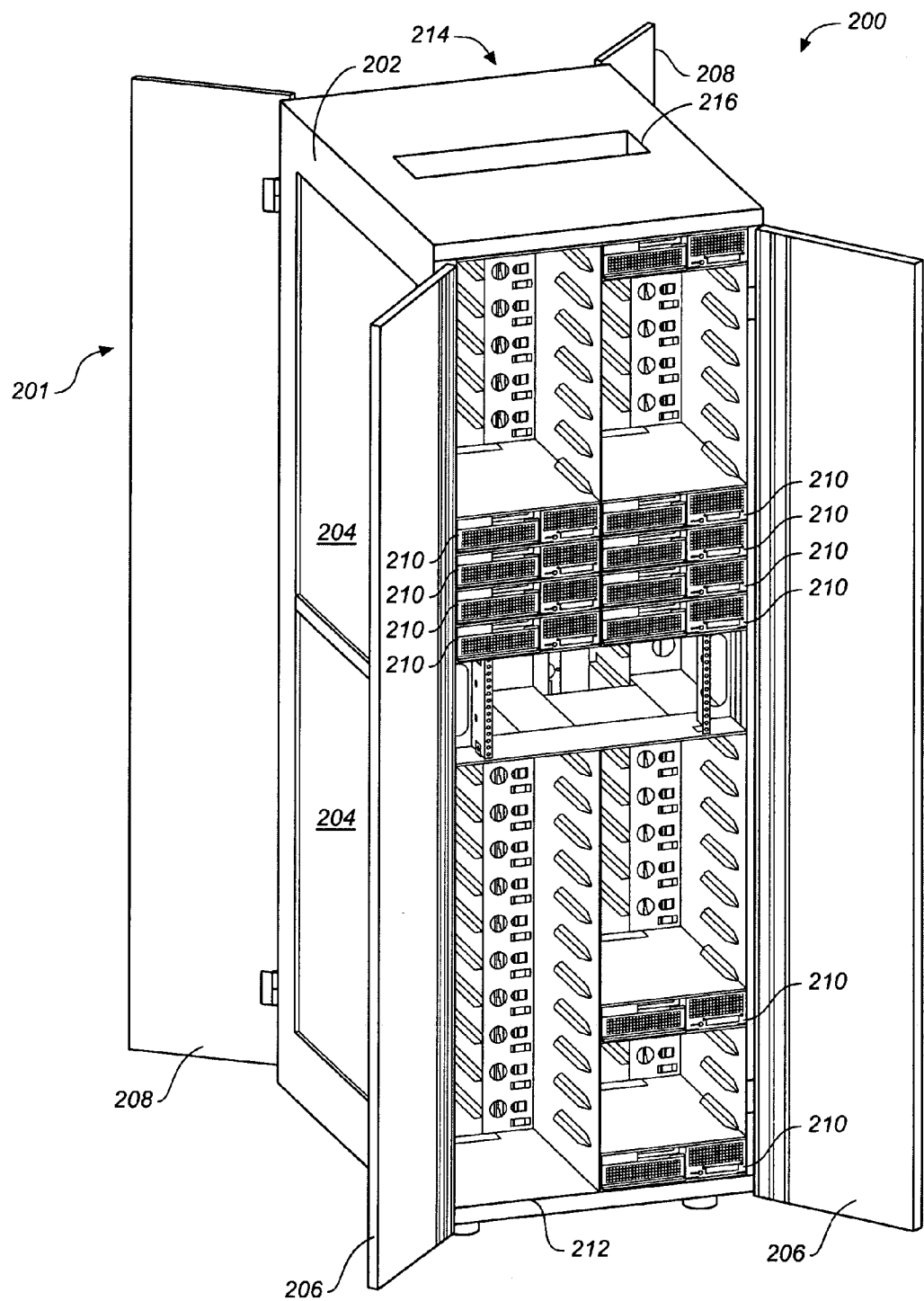
FIGS. 2A-2B show a rack-based computer system, in accordance with embodiments of the present invention.
Figure 2B:
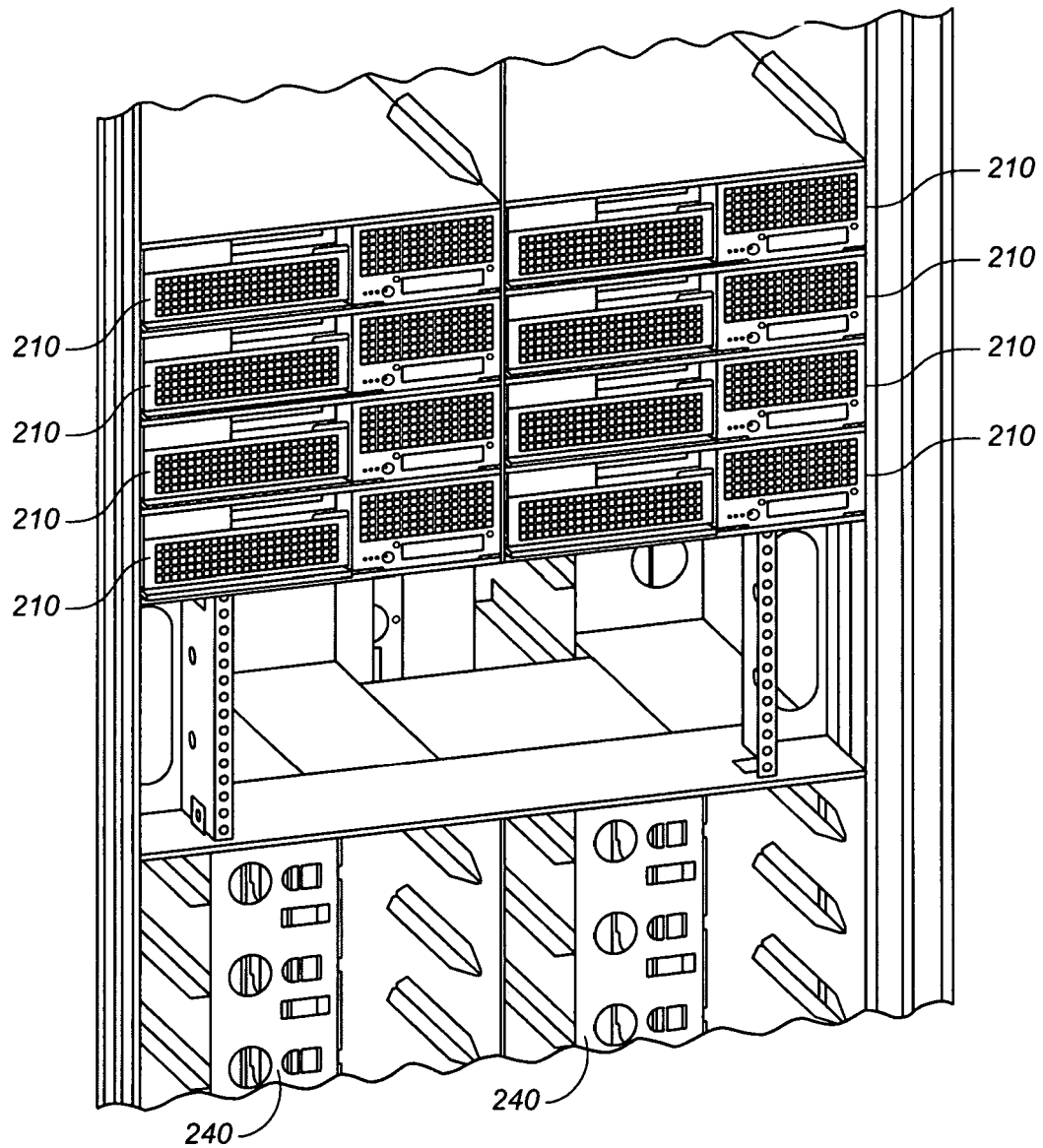

FIG. 2A shows a rack-based computer system 200 in accordance with embodiments of the present invention. FIG. 2B is an enlarged view of a portion of the computer system 200. The computer system 200 comprises a rack assembly 201 which provides the structural support for a plurality of computers 210 contained therein.

The rack assembly 201 may comprise a vertically elongated, floor mounted cabinet assembly. The rack assembly 201 may comprise a rectangular rack frame 202 externally covered by removable enclosure panels 204. An access door may be pivotally mounted on one or more sides of the rack assembly to provide access to the computers and other components (such as, e.g., routers, hubs, cabling, etc.) housed in the rack assembly 201. In other embodiments, the enclosure panels and access doors may be omitted or may be integrally formed with the rack frame 202. The rack assembly 201 may comprise a standard-sized rack, or may have different dimensions. In one embodiment, the rack assembly measures approximately 24" wide, 40" deep, and 74" high. In the embodiment illustrated in FIGS. 2A-2B, the rack assembly 201 comprises a front opening 212 and a rear opening 214. Side panels 204, front doors 206, and rear doors 208 are provided for enclosing the computer system 200. In the system 200 illustrated in FIGS. 2A-2B, the rack assembly 201 is only partially filled with computers 210, leaving room to add additional computers 210 into the system 200.

As can be seen in FIGS. 2A-2B, the computers 210 are positioned in a side-by-side orientation. Thus, when viewing the computers 210 through the front opening 212, two computers 210 can be seen positioned at each horizontal section of the rack assembly 201. Each computer 210 includes its own horizontally-oriented main board and other components to form a computer. This is in contrast with conventional rack-based systems in which each horizontal section of the rack contains a single computer chassis containing a single horizontally-oriented main board. This is also in contrast with conventional blade-type computer systems which may include multiple vertically-oriented blades arranged side-by-side.

In addition to the side-to-side arrangement of the computers 210, the rack assembly 201 may also support computers in a back-to-back arrangement. Thus, another set of side-by-side computers 210 can be accessed from the rear opening 214 of the rack assembly 201. The perspective view of the rear opening 214 would be similar to the perspective view of the front opening 212 shown in FIG. 2A. Thus, four vertically arranged stacks of computers 210 may be provided in the computer system 200. During operation, cooling air may be drawn through the computers 210 into a central air plenum positioned between the back sides of the computers 210 and then exhausted out of an exhaust port, such as top exhaust port 216.

Figure 3:
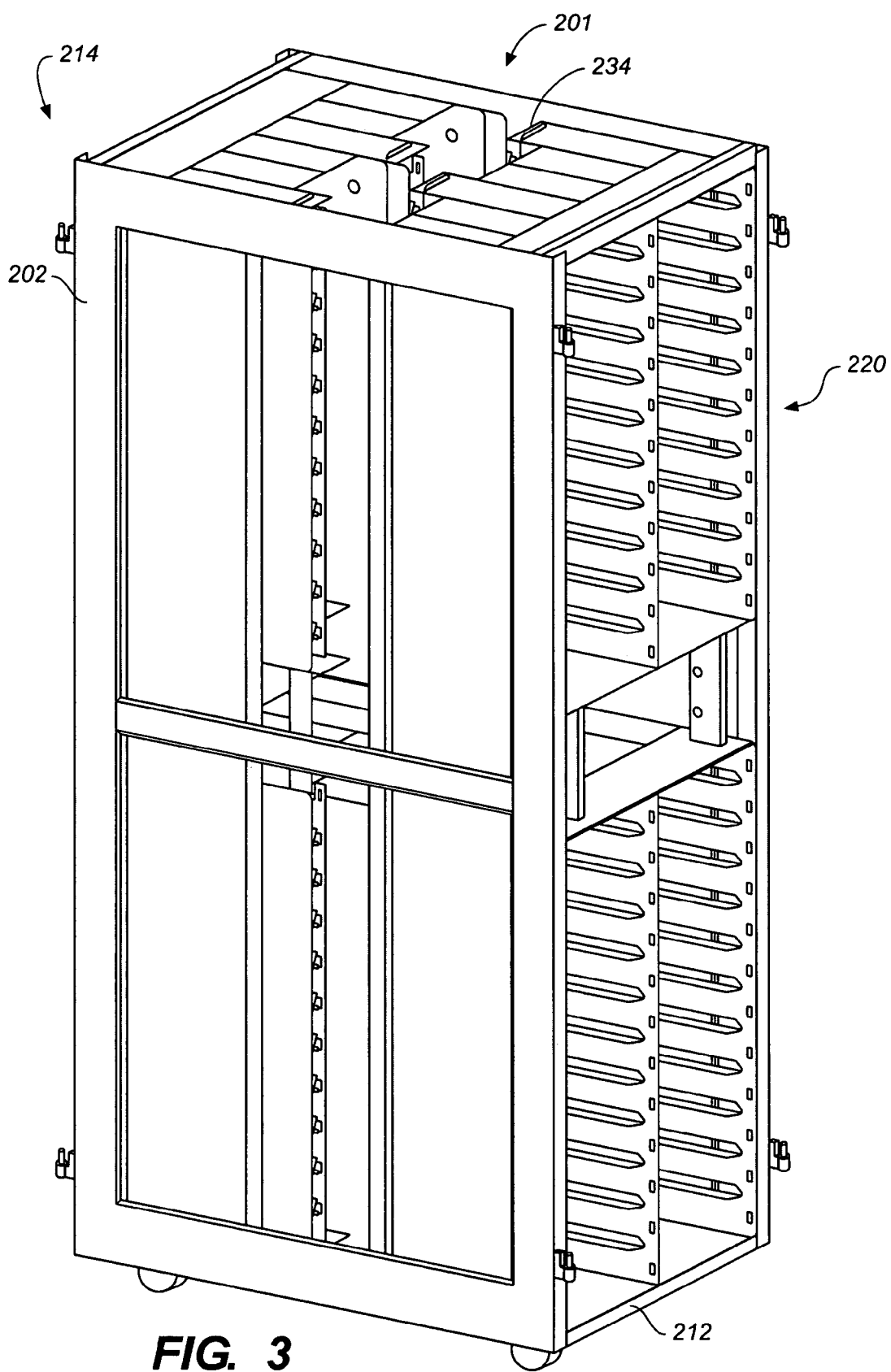
FIG. 3 is a perspective view of a rack assembly, in accordance with embodiments of the present invention.

FIG. 3 is a perspective view of the rack assembly 201 with front doors 206, rear doors 208, side panels 204, and computers 210 removed. The illustrated rack assembly 201 comprises a rack frame 202, which provides the main structural support for the various components of the computer system 200.

Figure 4:
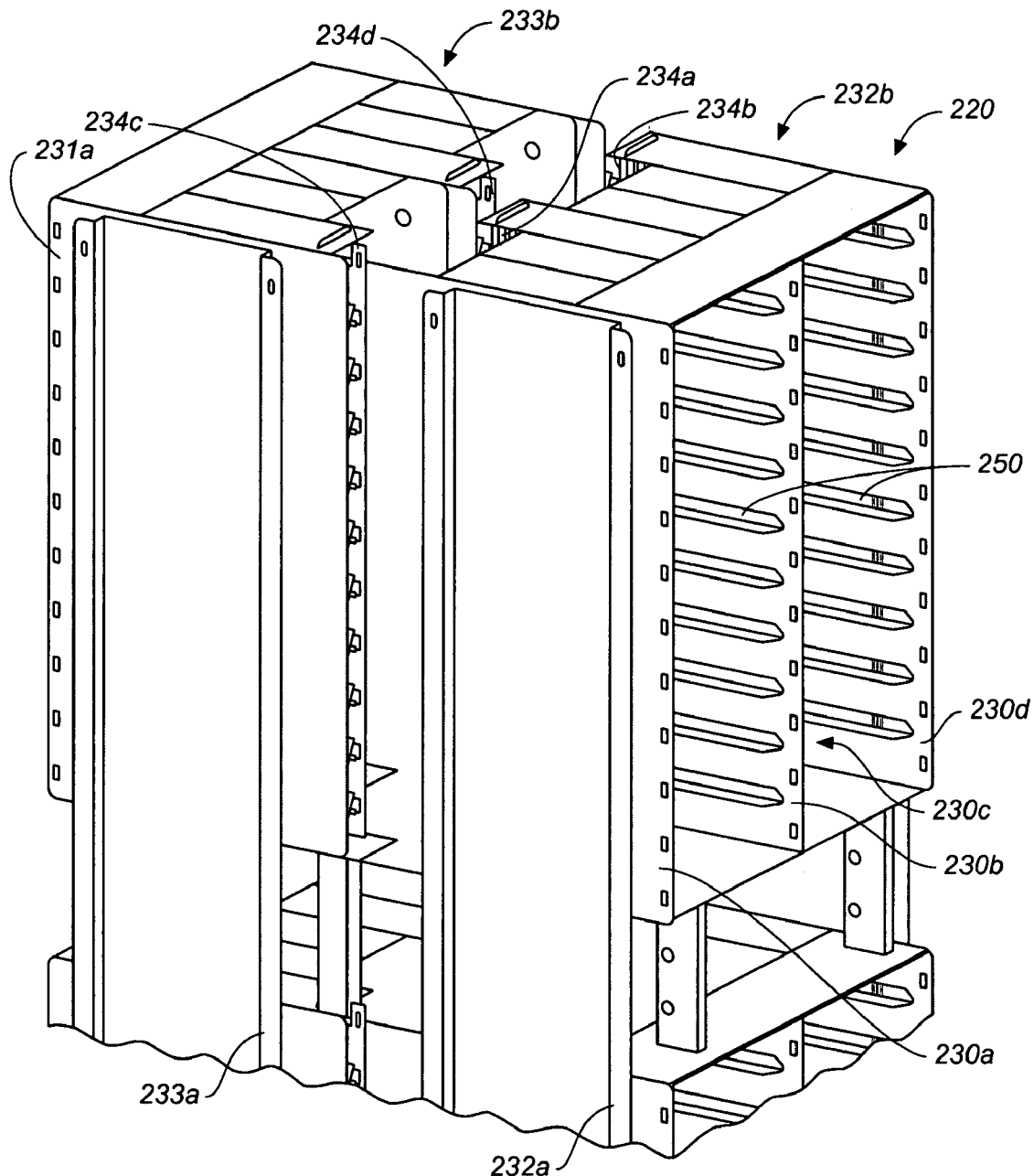
FIG. 4 is a perspective view of a portion of the rack assembly with the rack frame removed, in accordance with embodiments of the present invention.
Figure 5:
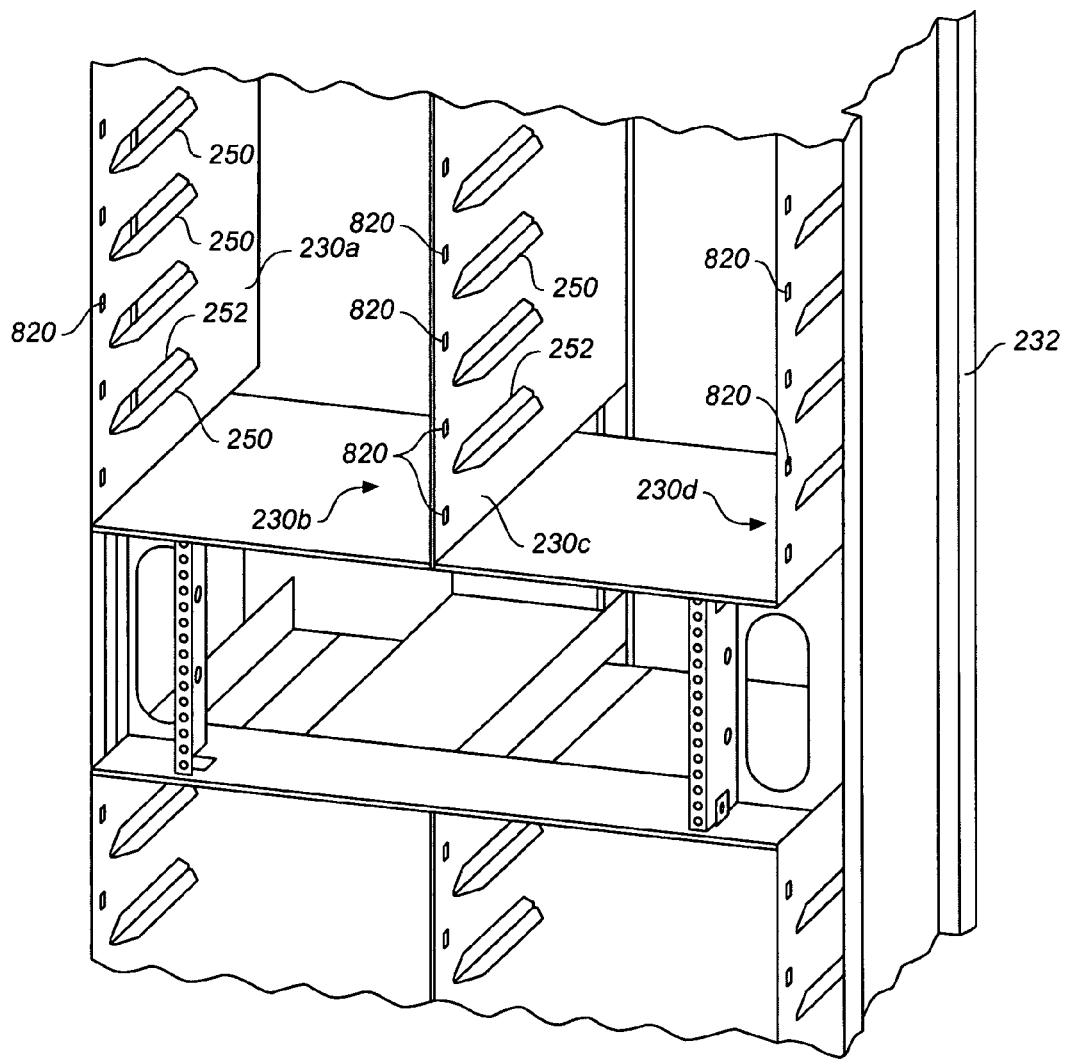
FIG. 5 is an enlarged perspective view of a central portion of the front portion of the computer system, in accordance with embodiments of the present invention.

FIG. 4 is a perspective view of a portion of the rack assembly 201 with the rack frame 202 removed. In this figure, the internal support structure 220 can be seen. The internal support structure 220 is supported by the rack frame 202 and comprises a front pair of mounting members 232a-232b and a rear pair of mounting members 233a-233b. The front mounting members 232a-232b are coupled to the rack frame 202 and support the front computer support plates 230a-230d. The rear mounting members 232b are also coupled to the rack frame 202 and support the rear computer support plates 231a-231d. The internal support structure 220 also comprises a plurality of rear supports 234, which are positioned to abut the back sides of the computers 210 when the computers 210 are fully inserted into the rack assembly 201. A first pair of rear supports 234a-234b are positioned to abut the back sides of the computers 210 in the front section of the rack assembly 201, and second pair of rear supports 234c-234d are positioned to abut the back sides of the computers 210 in the back section of the rack assembly 201. FIG. 5 is an enlarged perspective view of a central portion of the front section of the computer system 200.

Although the terms "front" and "rear" are used to describe various components in the illustrated computer system 200, it will be understood that these are relative terms used here for convenience. In the illustrated embodiment, the front section of the computer system 200 and the rear section of the computer system 200 are substantially identical, but oriented in opposite directions so that the front sides 601 of the computers 210 mounted in the front section can be accessed through the front opening 212, and the front sides 601 of the computers 210 mounted in the rear section can be accessed through the rear opening 214. The following text describes the front portion of the computer system 200. However, it will be understood that the description may apply to the rear portion as well.

Figure 6A:
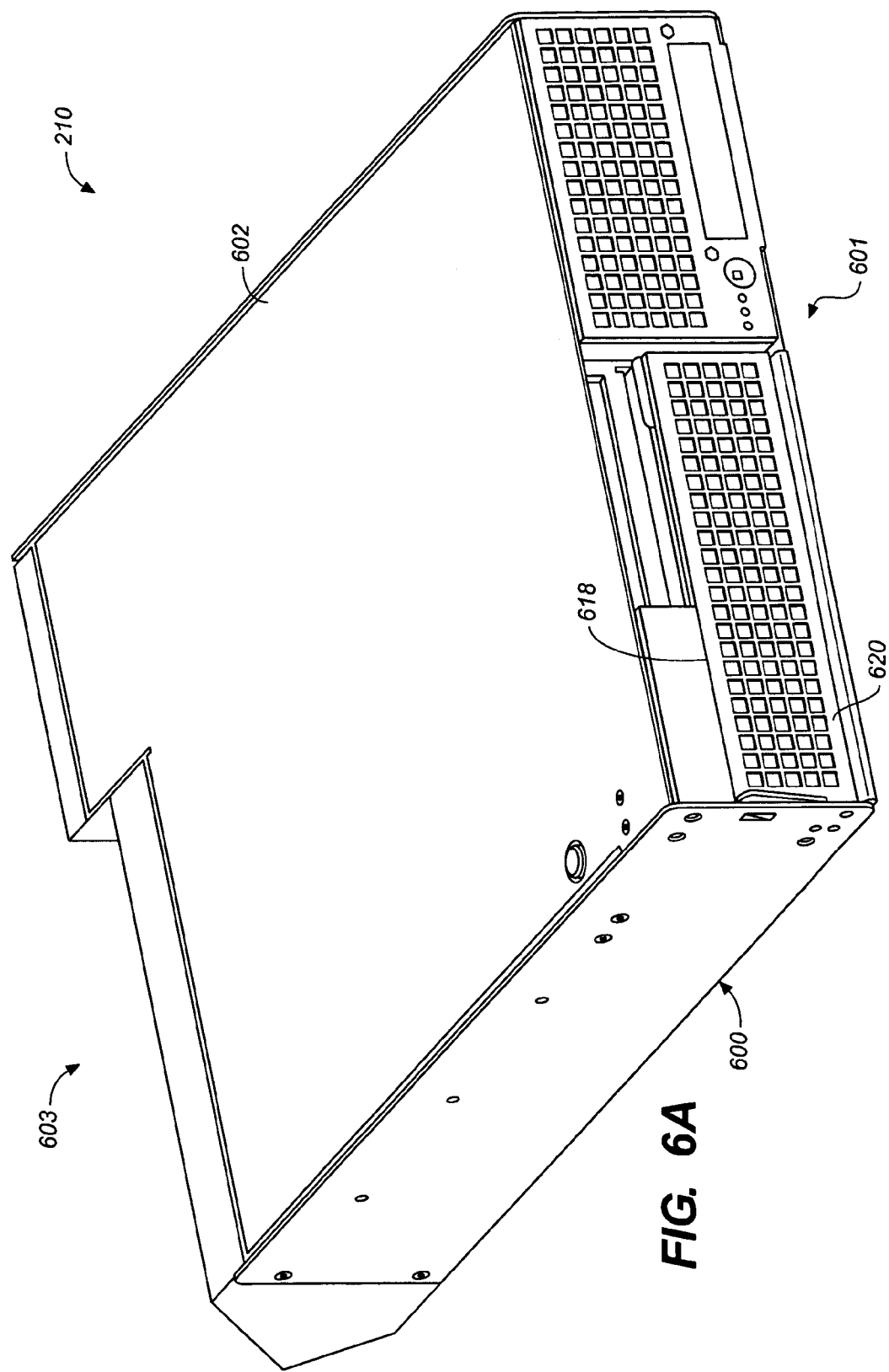

FIGS. 6A-6B are front perspective views of a computer 210 that can be mounted into the rack assembly 201. The computer 210 may comprise a computer chassis 600 containing a main board 610 and other components, such as one or more power supplies 612, hard drives 608, removable media drives 609, processors 624, and expansion cards, contained within the computer chassis 600. The chassis 600 may comprise a chassis top 602, which may be removable to provide access to the components contained therein. An exemplary computer 210 is described in greater detail in the following U.S. provisional patent applications: U.S. provisional patent application No. 60/569,025, entitled "RACK MOUNTED COMPUTER SYSTEM", filed May 7, 2004; U.S. provisional patent application No. 60/569,020, entitled "ELECTROMAGNETIC INTERFERENCE SHIELD FOR I/O PORTS", filed May 7, 2004; and U.S. provisional patent application No. 60/569,019, entitled "DIRECTIONAL FAN ASSEMBLY", filed May 7, 2004; each of which is incorporated herein by reference in its entirety.

A computer 210 may comprise any electronic system designed to perform computations and/or data processing. In some embodiments, the computer 210 comprises an electronic device having a central processing unit (CPU) and memory. The CPU and memory may be provided on a main board 610, which, in turn, may be mounted to the computer chassis 600. The basic circuitry and components used by a computer to function are generally either contained in or attached to the main board. The main board typically contains the system bus, processor and coprocessor sockets, memory sockets, serial and parallel ports, expansion slots, and peripheral controllers. This chassis 600 may comprise, for example, a housing that encloses all or portions of the main board 610 and components coupled thereto. Alternatively, the chassis 600 may comprise a minimal structure (such as, e.g., a tray or frame) which provides mechanical support for the main board 610. Alternatively, the computer may comprise a printed circuit board (PCB) main board having exposed components without an enclosure.

FIG. 6B is a perspective view of the front side 601 of the computer 210 with the chassis top 602 removed to expose the main board 630 and other components contained within the computer chassis 600. When the computers 210 are mounted in the rack assembly 201, the front sides 601 of the computers 210 are exposed to a user facing the front opening 212 of the rack assembly 201. As can be seen in FIGS. 6A-6B, the front side 601 of the computer 210 exposes various components which a user may wish to access to operate or maintain the computer system 200. These components may include, for example, one or more removable media drive ports, a mass storage device, and I/O connectors. The computer 210 may be provided with a front bezel which partially or fully covers the front of the computer 210. This bezel may be removable or pivotally mounted to enable the bezel to be opened to provide access to the various components. The bezel may function to reduce the effect of electromagnetic interference (EMI), to minimize the impact of environmental factors, and to improve the aesthetic appearance of the computer 210. In the embodiment illustrated in FIGS. 6A-6B, the I/O connectors are exposed by an I/O connector opening 618 in the computer chassis 600. The I/O connector opening 618 is covered by a movable I/O door 620, which provides EMI shielding.

Figure 7:
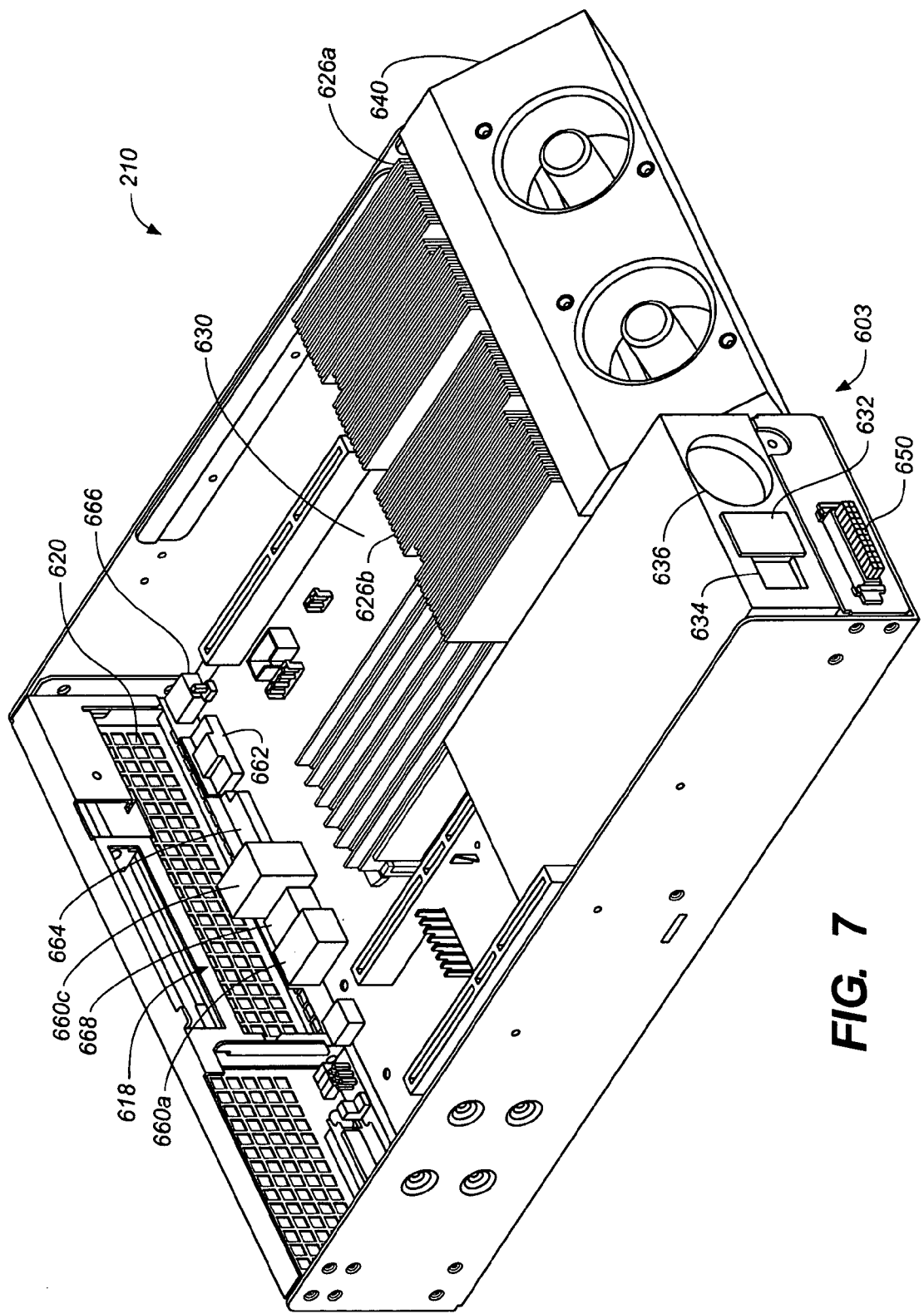
FIG. 7 is a perspective view of the rear side of the computer, in accordance with embodiments of the present invention.

FIG. 7 is a perspective view of the rear side 603 of the computer 210. The rear side 603 of the computer chassis 600 may comprise a directional fan assembly 640, a power port opening 632 for exposing a power connector of a power supply 612, a power switch opening 634, a power supply fan opening 636, and a chassis connector 650. In other embodiments, the rear side 603 may also include one or more additional apertures to accommodate other components, such as additional fans or I/O connectors, which may be added to alternative designs of the computer 210.

In the illustrated embodiment, the main board 630 includes a plurality of I/O connectors mounted to a top surface of the printed circuit board forming the main board 630. The types of I/O connectors may vary depending on the main board and chipset configuration, but may include, for example, one or more network connectors 660a-660c (shown in this embodiment as female RJ-45 connectors), a video port 662, a SCSI port 664, a USB port 666, and a serial port 668. The I/O connectors may further include, for example, IEEE 1394 ports, parallel ports, and mouse and/or keyboard ports, such as AT or PS/2 connectors.

In accordance with embodiments of the present invention, the main board 630 may be a standard, "off-the-shelf" main board designed for use in conventional computer systems. Accordingly, the I/O connectors are positioned along the edge of the main board 630 such that when the main board is installed in a conventional computer chassis, the I/O connectors are flush or nearly flush with the side of the computer chassis. The computer chassis would include an opening containing an I/O shield that exposes the I/O connectors, This enables a user to connect the I/O cables to the I/O connectors after the computer has been mounted in the rack.

Figure 8:
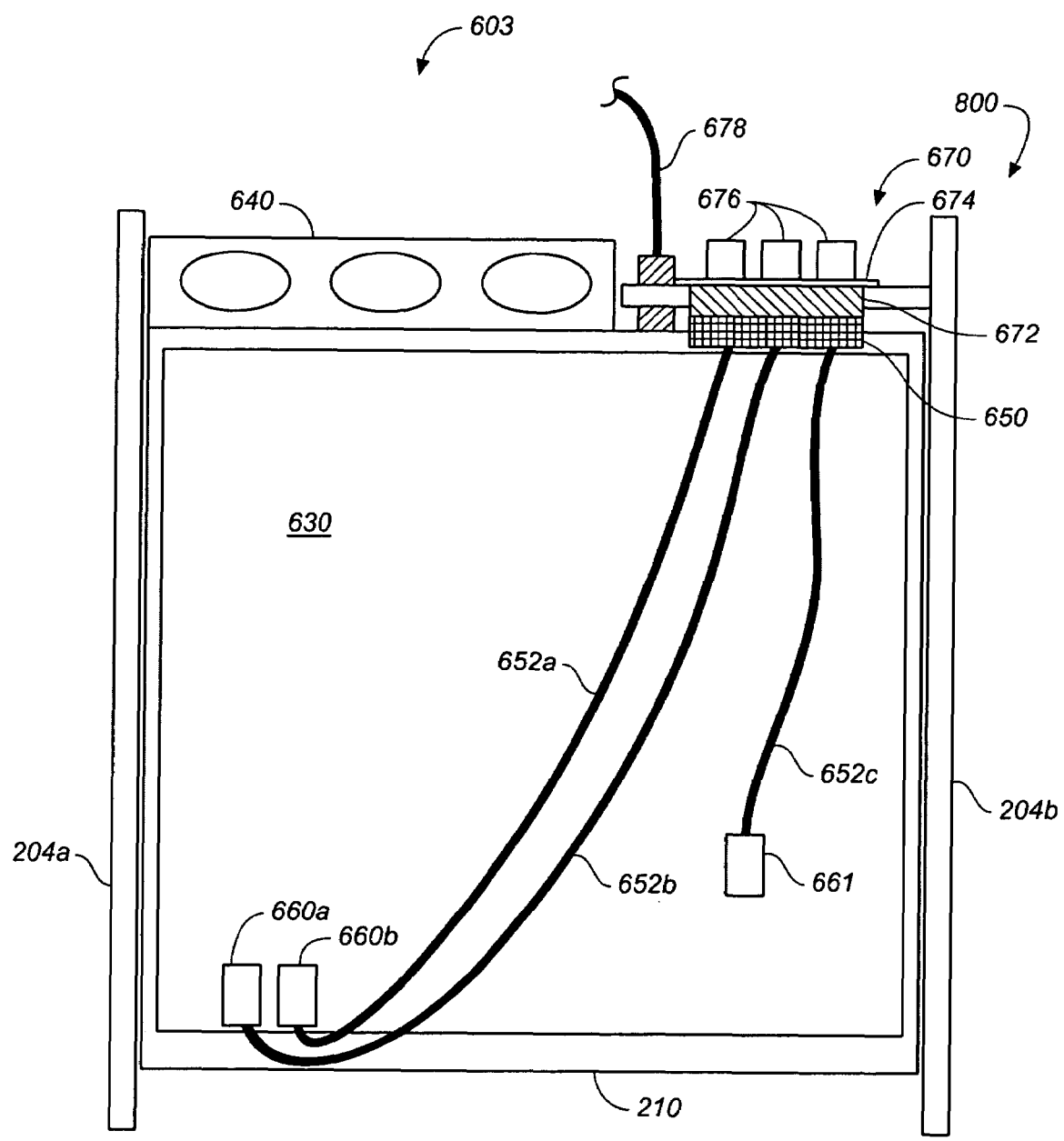
FIG. 8 is a simplified block diagram illustrating an arrangement for a single computer mounted in a rack assembly, in accordance with embodiments of the present invention.

In accordance with embodiments of the present invention, a connector grouping assembly 800 may be used to facilitate I/O connections between the computer 210 and other components in the rack assembly 201. FIG. 8 is a simplified block diagram illustrating an arrangement for a computer 210 mounted in the rack assembly 201. It will be understood that similar arrangements may be utilized for the other computers 210 in the rack assembly 201.

In this embodiment, the computer 210 is supported by the side panels 204a-204b of the rack assembly 201. The chassis connector 650 mounted to the rear side 603 of the computer chassis 600 is coupled to the proximal end of one or more I/O cables, shown in FIG. 8 as three I/O cables 652a-652c. The distal ends of these I/O cables 652a-652c may, in turn, be coupled to one or more I/O connectors on the main board 630. In FIG. 8, two of the I/O cables 652a-652b comprise two male RJ-45 network cables that are coupled with two of the female RJ-45 I/O connectors 660a-660b, and a third I/O cable 652c comprises a serial cable coupled to a serial connector 661 mounted elsewhere on the main board 630. This arrangement facilitates the electrical coupling of multiple I/O connectors 660a-660c on the main board 630 with a single chassis connector 650 mounted to the computer chassis 600.

The chassis connector 650 is positioned such that when the computer 210 is fully inserted into an available bay of the rack assembly 201, the chassis connector 650 mates with a rack I/O connector 672 of a blind mate I/O interface assembly 670, which is mounted to the rear support 234 of the rack assembly 201. In some embodiments, a power cable 678 may also be retained by the rear support 234 such that as the computer 210 is inserted into the rack assembly 201 and the chassis connector 650 mates with the rack I/O connector 672, the power cable 678 will also mate with a power connector of the power supply 612 on the computer 210. In this way, both data and power connectivity to the computer 210 may be provided by simply inserting the computer 210 into the rack assembly 201.

Figure 9A:
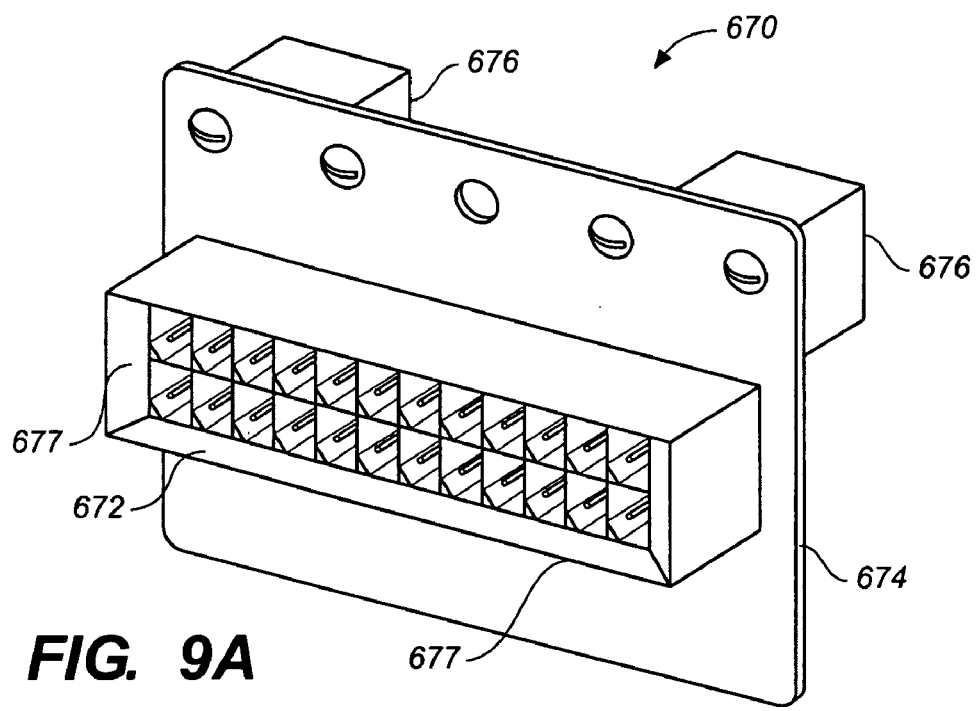
FIGS. 9A-9B show front and back perspective views of an exemplary I/O interface assembly, in accordance with embodiments of the present invention.
Figure 9B:
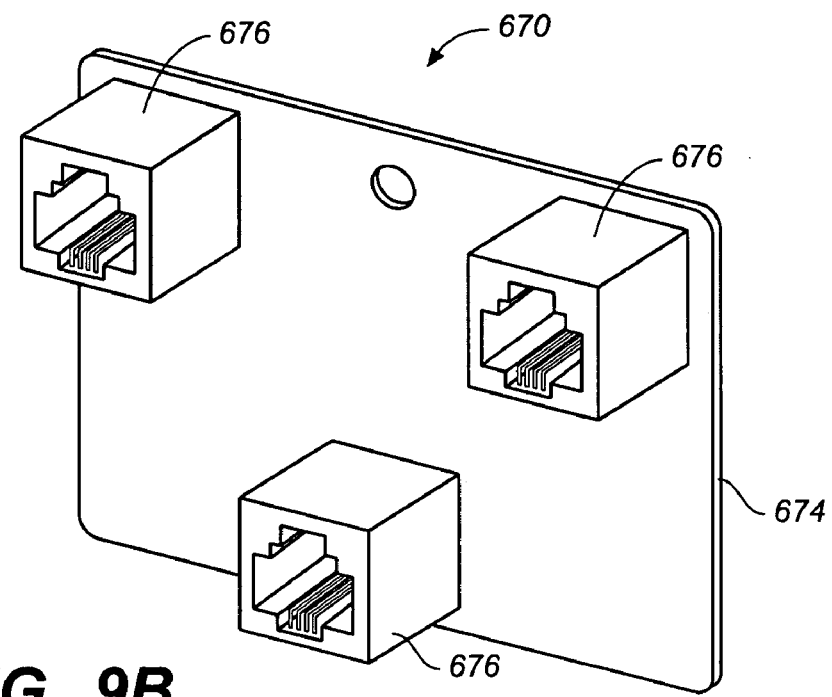

FIGS. 9A-9B show front and back perspective views of an exemplary I/O interface assembly 670. In this embodiment, the I/O interface assembly 670 comprises a printed circuit board 674 having the rack I/O connector 672 mounted to a front side and a plurality of I/O connectors 676 (shown as female RJ-45 connectors) mounted to a back side. In other embodiments, different quantities and types of connectors may be used. The PCB 674 provides the electrical connection between the contacts of the rack I/O connector 672 and the contacts of the I/O connectors 676. A plurality of similar I/O interface assemblies 670 may be fixedly coupled to each of the rear supports 234 of the rack assembly 201 to provide electrical connections to the chassis connectors 650 of each of the computers 210 mounted in the rack assembly 201.

Figure 10:
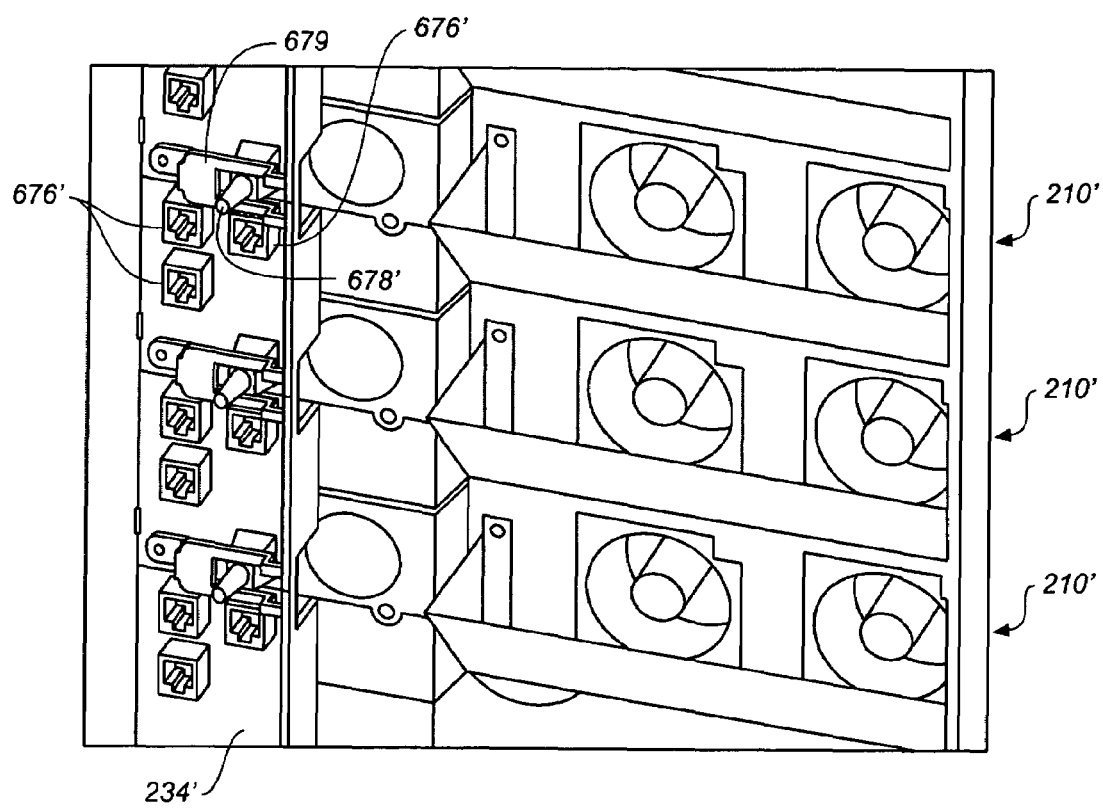
FIG. 10 shows a perspective view of a back sides of a plurality of computers fully inserted into a rack assembly, in accordance with embodiments of the present invention.

FIG. 10 shows a perspective view of a back sides of a plurality of computers 210' fully inserted into the rack assembly 201', in accordance with another embodiment of the present invention. Here, as in the embodiment shown in FIG. 8, the I/O connectors 676' of the I/O interface assembly 670' protrude from the back side of the rear support 234'. I/O cables (not shown) can be mated with these I/O connectors 676' to connect the connectors 676' with other components in the rack assembly 201, such as a switch or hub. Alternatively, these cables can be coupled with a component located outside of the rack assembly 201. FIG. 10 also shows that a flange 679 may be used to provide support for the power cable 678' (only partially shown in FIG. 10). Because the insertion force necessary to mate the power cable 678' with the power connector on the computer 210 may be fairly large, the flange 679 may be used to ensure that the power cable 678' is retained in place during mating.

In some embodiments, a gap may be provided between the edge of the main board 630 and the side of the computer chassis 600. This gap provides clearance for the I/O cables 652 to be plugged into the I/O connectors 660 and then routed towards the rear side 603 of the computer chassis 600. This change of direction for the cables 652 can be accomplished without having the cables 652 protrude from the front of the computer chassis 600. In some embodiments, the cables 652 may be fully contained within the computer chassis 600 such that they are only accessible by removing the chassis top 602 or by opening the I/O door 620. This can help to manage the number of cables in the computer system 200 and reduce the number of dangling cables in the rack assembly 201.

As described above, these cables 652 may be routed to the rear side 603 and may terminate at the chassis connector 650. The chassis connector 650 may comprise a coupling device which provides an electrical and mechanical connection to the corresponding rack connector 672. The chassis connector 650 and rack connector 672 may comprise plastic housings having metal conductors provided therein which provide electrical connectivity between the connectors 650, 672 when the connectors 650, 672 are mated. The chassis connector 650 may be mounted on the rear side wall of the computer chassis 600 such that one end of the chassis connector 650 is exposed to the interior of the computer chassis 600 and is coupled to the cables 652, and the other end is exposed to the exterior of the computer chassis 600 to be blind mated with the rack connector 672. When the chassis connector 650 is mated with the rack connector 672, the two connectors 650, 672 may bridge the gap in an electrical or fiber optic circuit. In one embodiment, the chassis connector 650 comprises a Micro-Fit 3.0, BMI™ Panel-to-Panel Receptacle, part no. 44133, and the rack connector 672 comprises a Micro-Fit 3.0, BMI™ Panel-to-Panel Plug, part no. 44300, both by Molex, Inc., of Lisle, Ill. In other embodiments, different types of connectors may be used.

In the illustrated embodiment, the rack connector 672 comprises a female connector and the chassis connector 650 comprises a male connector. As shown in FIG. 9A, the female rack connector 672 may include sloped surfaces 677 that can help to guide the male chassis connector 650 to accurately mate with the female connector 672 when the two connectors 650, 672 are not perfectly aligned during insertion of the computer 210. In other embodiments, different types of connector designs may be used.

Embodiments of the present invention may provide a cable management solution that enables blind mating of I/O connectors in a rack-based computer system in conjunction with standard main board and chipset designs. Embodiments may also provide a computer chassis and rack system design which can be utilized with a variety of main board configurations.

Because various main board manufacturers may produce slightly or significantly differing designs, the locations of the various I/O connectors on each main board design may vary. Accordingly, it may be difficult to provide a single blind mating design that can accommodate future main board layouts. Embodiments of the present invention may be used for connecting the I/O connectors on any main board design to a single blind mating connector using flexible cables that can be coupled to connectors located anywhere in the computer 210. By providing a single blind mating connector at the back of the chassis, the rack assembly may be used in conjunction with a variety of main boards, regardless of the precise locations of the I/O connectors.

In accordance with embodiments of the present invention, the embodiments described above may enable a low cost, industry standard, "off-the-shelf" main board to be used in a computer system, while providing some of the advantages of "blade"-type systems. In particular, data and power connectivity with the computer 210 may be obtained by simply inserting the computer 210 into an available bay in the rack assembly 201. In some embodiments, no additional cable attachments are needed for operation of the computer system 200. This can also improve serviceability of the computers 210. In conventional systems, when hardware failures occur, the operator may need to disconnect multiple network and power cables before removing a computer from a rack assembly. In the illustrated embodiments, the network and power connections can be automatically disconnected by simply withdrawing the computer 210 from the rack assembly 201. This can facilitate rapid maintenance and/or replacement of the computers 210. In addition, because the I/O connectors 676 of the I/O interface assembly 670 are mounted to the rack assembly 201 and not the computer chassis 600, the I/O cables connected to the I/O connectors 676 can remain connected to the I/O connectors 676 even after the computer 210 is removed from the rack assembly 201. This can help to reduce the labor required to manage the various cables of the computer system 200. In some embodiments, it may be desirable to attach all of the I/O cables to all of the I/O connectors 676 prior to installation of any computers 210. This will prepare the computer system 200 to be rapidly populated with any number of computers 210.

In addition, when cables 652 are used to couple the chassis connector 650 with the I/O connectors 660 on the main board 630, the precise locations of the I/O connectors 660 are not limiting. In other words, the I/O connectors 660 may be located anywhere in the computer 210, and the cables 652 can still be used to couple the I/O connectors 660 to the chassis connector 650. It is not necessary to have a custom-designed motherboard, such as those used in conventional "blade" systems. In addition, a computer manufacturer may use the same chassis design with different main board layouts, thus allowing a single chassis and rack assembly design to be used with a variety of different computer types.

In accordance with embodiments of the present invention, the I/O connectors 676 on the I/O interface assembly 670 may be identical to the I/O connectors 660 located at the front section of the computer 210, thereby enabling the same cables which would have been coupled with the I/O connectors 660 in the computer 210 to be connected to the I/O connectors 676 on the I/O interface assembly 670. This may facilitate the use of more standard "off-the-shelf" components in the computer system, thereby decreasing overall costs.

In accordance with other embodiments of the present invention, an optional location pin may be provided on the computer chassis for mating with a location hole on the rack assembly. The location pin may be used to provide a datum for consistently and accurately mounting the computer 210 in the rack assembly 201. The location pin may be sized such that the location pin mates with the location hole before the I/O connector on the computer 210 reaches the I/O connector on the rack assembly 201. This ensures that the computer 210 is properly aligned with the rack assembly 201 so that the I/O connectors will reliably mate each time that the computer 210 is inserted into the rack assembly 201.

While the invention has been described in terms of particular embodiments and illustrative figures, those of ordinary skill in the art will recognize that the invention is not limited to the embodiments or figures described. For example, in the embodiments described above, the I/O connectors 660a-660b comprise RJ-45 network connectors. In other embodiments, the connectors which are coupled to the chassis connector 650 via cables 652 may comprise other types of data and/or power connectors, such as, e.g., SCS1, fibre channel, USB, and the like. In addition, the cables 652 coupling the connectors on the main board 630 with the chassis connector 650 may vary in number and type. For example, two of the cables 652 may be network cables coupled to RJ-45 network ports and a third cable 652 coupled to a serial port. The two I/O connectors 660a-660b may comprise, for example, gigabit NICs. In another embodiment, for example, one of the cables 652 may be coupled to a network port, one of the cables 652 may be coupled to a USB port, and one of the cables 652 may be left uncoupled and reserved for potential future use. In some embodiments, a plurality of extra cables 652 having one or more different interface types may be provided for potential future use.

In addition, the cables 652 may be bundled together or separated. It may be desirable to bundle all of the cables 652 together when the connectors to which the cables 652 are intended to be coupled are closely spaced on the main board. This can help to reduce the cable clutter within the computer chassis and improve cooling airflow therethrough. In other embodiments, it may be desirable to have one or more of the cables 652 partially or fully separated from the other cables 652 so that each cable 652 can be easily routed to couple with connectors positioned at distal locations on the main board.

It may further be desirable to select the length of the cables 652 based on the main board and computer component layout within the computer chassis. In some instances, it may be desirable to minimize the length of the cables 652 based on the expected location of the connector on the main board. This can help to reduce the cost of the cables 652. In other instances, it may be desirable to have longer cables 652 so that there is sufficient length in the cables 652 to route the cables 652 through the computer chassis in a way that optimizes cooling airflow and/or cable clutter. For example, it may be desirable to run the cables alongside the interior walls of the computer chassis 600 or other components such as the power supply 612. It may also be desirable to use long cables 652 so that the cables 652 can be used with a variety of main board designs.

In the illustrated embodiment, a single chassis connector 650 is mounted to the back side of the computer 210 and is coupled to multiple cables 652a-652c. In other embodiments, multiple chassis connectors may be mounted to the back side of the computer, each of the chassis connectors being coupled to one or more cables. Each of these chassis connectors can be used to electrically couple a connector on the main board with a corresponding rack connector on the rack assembly. Because the chassis connectors are mounted either directly or indirectly to the computer chassis, the chassis connector can be blind mated with the rack connector using the insertion force provided to insert the computer into the bay of the rack assembly.

In various embodiments, the arrangement of computers 210 in the rack assembly 201 may vary. For example, although the illustrated system includes four stacks of computers 210 arranged side-by-side and back-to-back, in other embodiments, the computers 210 may be arranged differently. For example, the computers may be arranged in a single stack, as is commonly used in the industry. In other embodiments, the computers may be vertically oriented, as opposed to the horizontally-oriented computers 210 shown in the figures. In some embodiments, the computers may have different form factors (e.g., some computers have a 1U profile, while others have a 2U or 3U profile) and may be configured to perform different tasks (e.g., one or more computers may be configured as a central controllers, while other computers in the stack may be configured as storage arrays).

In addition, the figures provided are merely representational and may not be drawn to scale. Certain proportions thereof may be exaggerated, while others may be minimized. The figures are intended to illustrate various implementations of the invention that can be understood and appropriately carried out by those of ordinary skill in the art.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed as new and desired to be protected by Letters Patent of the United States is:

1. A computer system, comprising:
    a computer chassis;
    a main board provided in the computer chassis, the main board comprising a printed circuit board having a plurality of components provided thereon, the plurality of components comprising at least one I/O connector;
    a chassis connector coupled to the computer chassis and configured to couple with a rack connector in a rack assembly; and
    one or more I/O cables, each I/O cable coupling one of the at least one I/O connector to the chassis connector;
    wherein the computer chassis comprises a front side, an opposing back side, and a front section adjacent the front side of the computer chassis;
    wherein the at least one I/O connector is positioned in the front section of the computer chassis;
    wherein the main board comprises a front edge positioned in the front section of the computer chassis;
    wherein one or more of the at least one I/O connectors is provided along the front edge of the main board;
    wherein a gap is provided between the front edge of the main board and the front side of the computer chassis; and
    wherein the one or more I/O cables are positioned partially in the gap and do not extend beyond the front side of the computer chassis.

2. A computer system, comprising:
    a computer chassis;
    a main board provided in the computer chassis, the main board comprising a printed circuit board having a plurality of components provided thereon, the plurality of components comprising at least one I/O connector;
    a chassis connector coupled to the computer chassis and configured to couple with a rack connector in a rack assembly; and
    one or more I/O cables, each I/O cable coupling one of the at least one I/O connector to the chassis connector; and
    a rack assembly configured to support a plurality of computer systems, the rack assembly comprising a connector support and an I/O interface assembly supported by the connector support and coupled to the chassis connector positioned along a back side of the computer chassis.

3. The system of claim 2, wherein the I/O interface assembly comprises a rack connector coupled to the chassis connector and at least one interface connector electrically coupled to the rack connector.

4. The system of claim 2, further comprising a plurality of I/O interface assemblies supported by the connector support and positioned to couple with a plurality of computer chassis mounted in the rack assembly.

5. The system of claim 2, wherein:
    the rack assembly is configured to support two stacks of computer systems such that the back sides of the computer systems in the first stack of computer system face the back sides of the computers systems in the second stack of computer systems; and
    the connector support is positioned between the two stacks of computer systems.

6. A computer assembly comprising:
    a rack having a plurality of I/O connectors; and
    a plurality of computers positioned within the rack, wherein each of the plurality of computers are enclosed within a chassis and comprises a main board and a chassis connector mounted to a rear side of the chassis, such that when each of the plurality of computers is inserted into one of a plurality of bays within the rack, the chassis connector engages one of the plurality of I/O connectors, wherein the chassis connector is coupled to distal ends of a plurality of I/O cables, and wherein proximal ends of the plurality of I/O cables are coupled to the main board;
    wherein the plurality of I/O cables comprises two network cables.

7. The computer assembly of claim 6, wherein the plurality of I/O cables further comprises a serial cable, and each of the two network cables comprises a network cable with RJ-45 connectors.

8. The computer assembly of claim 6, wherein each of the computers further comprises a power connector mounted to the rear side of the chassis for engaging one of a plurality of power supply cables within the computer rack.

9. The computer assembly of claim 8 wherein the chassis connector and the power connector within each of the plurality of computers are configured such that when each of the plurality of computers is slid into one of the plurality of bays within the rack, the chassis connector and the power connector simultaneouslx engage one of the plurality of I/O connectors and one of the plurality of power supply cables, respectively.

* * * * *